(12) United States Patent
Nakamura

(10) Patent No.: US 11,156,672 B2
(45) Date of Patent: Oct. 26, 2021

(54) SEMICONDUCTOR DEVICE

(71) Applicant: RENESAS ELECTRONICS CORPORATION, Tokyo (JP)

(72) Inventor: Hirotsugu Nakamura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/828,496

(22) Filed: Mar. 24, 2020

(65) Prior Publication Data
US 2020/0341075 A1    Oct. 29, 2020

(30) Foreign Application Priority Data

Apr. 23, 2019    (JP) .............................. JP2019-082312

(51) Int. Cl.
    *G01R 31/71*    (2020.01)
(52) U.S. Cl.
    CPC .................................... *G01R 31/71* (2020.01)
(58) Field of Classification Search
    None
    See application file for complete search history.

(56) References Cited

U.S. PATENT DOCUMENTS

| 6,785,106 B2* | 8/2004 | Nagata ............... G01R 31/2884 361/86 |
| 9,797,945 B2* | 10/2017 | Yamamoto ............ H01L 21/822 |
| 10,067,182 B2* | 9/2018 | Yamamoto ............ H01L 21/822 |
| 2017/0269153 A1* | 9/2017 | Yamamoto ....... G01R 31/31721 |
| 2018/0196105 A1* | 7/2018 | Inukai ................ G01R 31/3835 |

FOREIGN PATENT DOCUMENTS

JP    2014-163917 A    9/2014

* cited by examiner

*Primary Examiner* — Jermele M Hollington
(74) *Attorney, Agent, or Firm* — McDermott Will & Emery LLP

(57) ABSTRACT

A semiconductor device includes first and second power supply terminals to which a first power supply voltage is supplied, a third power supply terminal to which a second power supply voltage is supplied, a power supply wiring coupled to the first and second power supply terminals, an abnormality detection circuit which diagnoses the first power supply terminal, a first current generation circuit which flows a current from the power supply wiring to the third power supply terminal in a diagnosis, and a second current generation circuit which couples to the power supply wiring at a vicinity of the first power supply terminal and flows a current from the power supply wiring to the third power supply terminal in the diagnosis. And, the abnormality detection circuit compares a voltage of the first current generation circuit with a voltage of the second current generation circuit in the diagnosis.

5 Claims, 13 Drawing Sheets

SEMICONDUCTOR DEVICE

CROSS-REFERENCE TO RELATED APPLICATIONS

The disclosure of Japanese Patent Application No. 2019-082312 filed on Apr. 23, 2019 including the specification, drawings and abstract is incorporated herein by reference in its entirety.

BACKGROUND

This invention relates to detecting a soldering failure of a semiconductor device having a plurality of power supply terminals and a disconnection of a bonding wire.

The Background of the Invention

In recent years, in electronic systems including a semiconductor device and a semiconductor device, which are required to have high reliability, a plurality of power supply terminals is provided for one power supply voltage used in a semiconductor device. This is because the following effects are obtained by providing a plurality of power supply terminals. The quality of the power supply voltage to the respective elements in the semiconductor device can be improved, i.e., the power supply voltage in the semiconductor can be prevented from voltage dropping. Even if there is a soldering defect or a disconnection of the bonding wire in one power supply terminal, it is possible to continue supplying the power supply voltage from the other power supply terminal.

Patent Document 1 describes a technique for detecting a power supply voltage abnormality in a semiconductor device having a plurality of power supply terminals. More specifically, power supply test circuits for testing power supply voltages are provided in the vicinity of the power supply pads of the semiconductor device. The power supply test circuit detects an abnormal state when the power supply voltage supplied to the vicinity power supply pad is lower than the threshold voltage. As described above, in the semiconductor device where one power supply voltage is supplied from a plurality of power supply terminals, even if one power supply pad is disconnected, the power supply voltage is maintained by the other power supply pad. However, detecting that the power supply voltage is lower than the threshold voltage by the power supply test circuit means that the power supply pad in the vicinity is supplied with power with a voltage drop from another power supply pad. That is, it means that a disconnection (or a soldering failure) occurs in the power supply pad in the vicinity thereof. In such cases, the operation of the semiconductor device is not completely stopped, but there is a possibility that the operation is defective, so that the Patent Document 1 detects an abnormal condition.

Prior-Art Document

Patent Document

[Patent Document 1] Japanese Unexamined Publication Laid-Open No. 2014-163917

SUMMARY

However, since the abnormal state is detected by the power supply test circuit by comparing the monitored voltage with the threshold voltage, there is a possibility of erroneous detection. This is because the drop of the power supply voltage is not constant because it is determined by the current consumption of the element operating at that time. Therefore, there is a possibility of erroneous detection depending on the setting of the threshold voltage.

A semiconductor device according to one embodiment includes first and second power supply terminals to which a first power supply voltage is supplied, a third power supply terminal to which a second power supply voltage is supplied, a power supply wiring coupled to the first and second power supply terminals, an abnormality detection circuit which diagnoses the first power supply terminal, a first current generation circuit which flows a current from the power supply wiring to the third power supply terminal in a diagnosis, and a second current generation circuit which couples to the power supply wiring at a vicinity of the first power supply terminal and flows a current from the power supply wiring to the third power supply terminal in the diagnosis. And, the abnormality detection circuit compares a voltage of the first current generation circuit with a voltage of the second current generation circuit in the diagnosis.

According to the semiconductor device, it is possible to improve the accuracy of detecting an abnormal condition of the power supply terminal.

DETAILED DESCRIPTION

Figure 1:
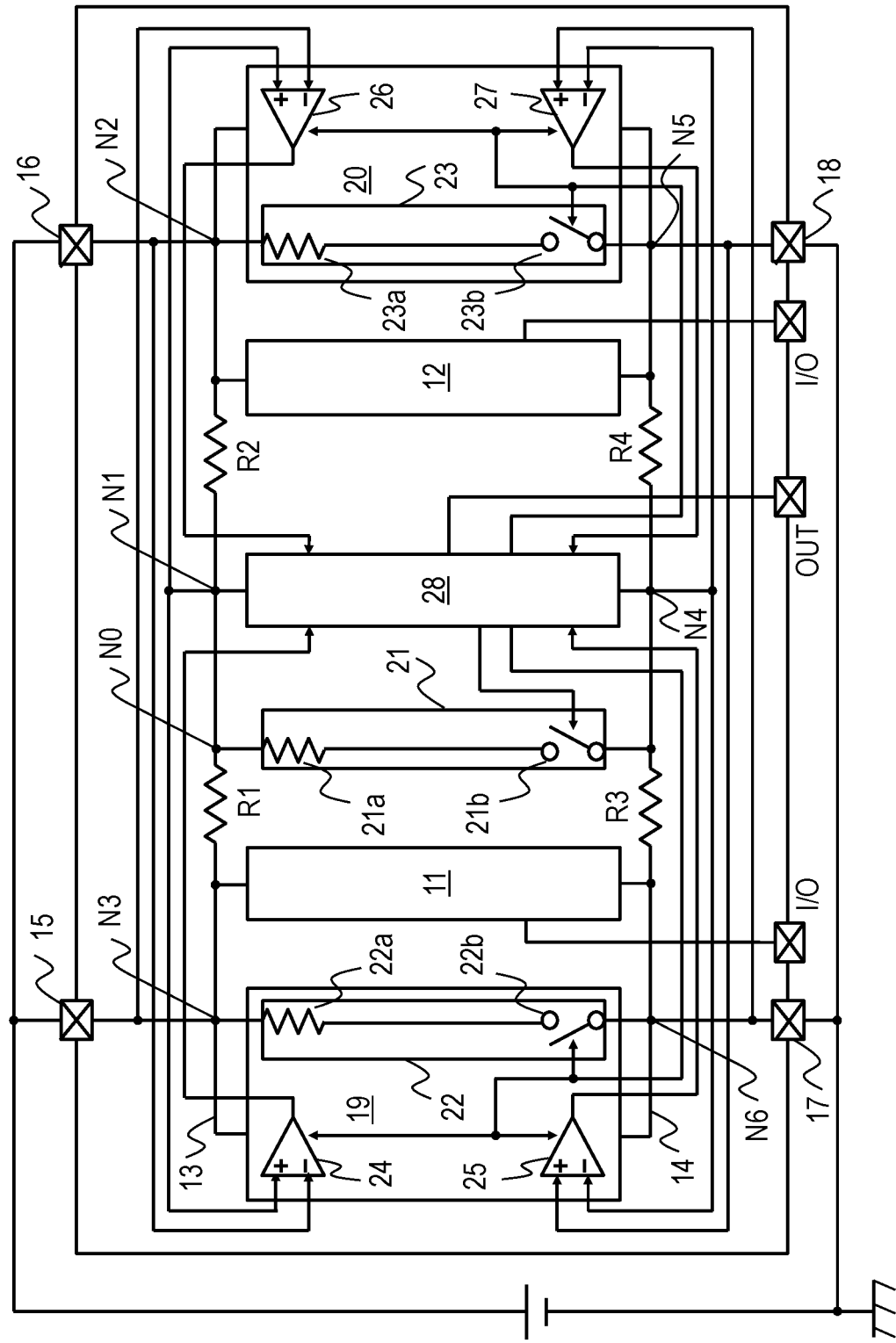
FIG. 1 is a schematic diagram of a semiconductor device according to a first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a block diagram showing a configuration of a semiconductor device 10 according to the first embodiment.

As shown in FIG. 1, the semiconductor device 10 includes internal circuits 11 and 12, and includes a power supply wiring 13 for supplying a first power supply voltage to the internal circuits 11 and 12, and a power supply wiring 14 for supplying a second power supply voltage to the internal circuits 11 and 12. Power supply terminals 15 and 16 for receiving power supply from an external power supply are connected to the power supply wiring 13. Similarly, power supply terminals 17 and 18 are connected to the power supply wiring 14. Here, the first power supply voltage is a power supply voltage such as 5 V or 3 V, and the second power supply voltage is a ground voltage. The internal circuits 11 and 12 are input/output circuits (I/O circuits) and/or functional circuits for realizing predetermined functions. Although two internal circuits are described in FIG. 1 for simplification of description, three or more internal circuits may be provided. Although two kinds of power supply voltages are described, a circuit using various kinds of power supply voltages in a plurality of internal circuits, a so-called multiple power supply circuit, may be used. In the case of a multiple power supply circuit, a plurality of power supply terminals is provided for each power supply wiring.

The semiconductor device 10 further includes abnormality detecting circuits 19 and 20, a current generating circuit 21, and a control circuit 28. The abnormality detection circuits 19 and 20 and the current generation circuit 21 operate with the first and second power supply voltages. The abnormality detection circuit 19 is connected to the power supply wires 13 and 14 in the vicinity of the power supply terminals 15 and 17, i.e., the nodes N3 and N6. The abnormality detection circuit 20 is connected to the power supply wires 13 and 14 in the vicinity of the power supply terminals 16 and 18, i.e., the nodes N2 and N5. The current generating circuit 21 is connected to the power supply wiring 13 at an intermediate point as viewed from the power supply terminals 15 and 16, that is, at a point (node N1) farther from the abnormality detecting circuits 19 and 20. The current generating circuit 21 is connected to the power supply wiring 14 at an intermediate point seen from the power supply terminals 17 and 18, that is, at a point (node N4) away from the abnormality detecting circuits 19 and 20. In other words, the abnormality detection circuit 19 is connected to the power supply wires 13 and 14 at a point closer to the power supply terminals 15 and 17 than the point at which the current generation circuit 21 is connected to the power supply wirings 13 and 14. The same applies to the abnormality detection circuit 20. The abnormality detection circuit 19 includes a current generation circuit 22 and comparators 24 and 25. Similarly, the abnormality detection circuit 20 includes a current generation circuit 23 and comparators 26 and 27. The current generating circuits 21, 22, and 23 are composed of resistors 21a, 22a, and 23a and switches 21b, 22b, and 23b, respectively. The resistors R1 and R2 represent wiring resistances of the power supply wiring 13. Similarly, the resistors R3 and R4 indicate the wiring resistances of the power supply wiring 14.

The arrangement of the abnormality detection circuits 19 and 20 will be described in more detail. The comparators 24 to 27 in the abnormality detection circuits 19 and 20 operate with the first and second power supply voltages. The comparators 24 and 25 are connected to the power supply wiring 13 in the vicinity of the power supply terminal 15 to be supplied with the first power supply voltage, and are connected to the power supply wiring 14 in the vicinity of the power supply terminal 17 to be supplied with the second power supply voltage. The comparators 26 and 27 are connected to the power supply wiring 13 in the vicinity of the power supply terminal 16 to be supplied with the first power supply voltage, and are connected to the power supply wiring 14 in the vicinity of the power supply terminal 18 to be supplied with the second power supply voltage. One end of the resistor 22a in the current generating circuit 22 is connected to the power supply wiring 13 in the vicinity of the power supply terminal 15, and the other end is connected to the power supply wiring 14 in the vicinity of the power supply terminal 17 via the switch 22b. One end of the resistor 23a in the current generating circuit 23 is connected to the power supply wiring 13 in the vicinity of the power supply terminal 16, and the other end is connected to the power supply wiring 14 in the vicinity of the power supply terminal 18 via the switch 23b.

The arrangement of the current generating circuit 21 will be described in more detail. One end of the resistor 21a in the current generating circuit 21 is connected to the node N1, and the other end is connected to the node N4 via the switch 21b. In other words, the current generating circuit 21 is connected to the power supply terminal 15 via a wiring resistor R1 having a resistance value larger than that of a wiring connecting the abnormality detecting circuit 19 to the power supply terminal 15. In addition, the current generating circuit 21 is connected to the power supply terminal 16 via a wiring resistance R2 larger than the resistance of the wiring connecting the abnormality detecting circuit 20 to the power supply terminal 16. The current generating circuit 21 is connected to the power supply terminal 17 via a wiring resistor R3 having a resistance value larger than that of a wiring connecting the abnormality detecting circuit 19 to the power supply terminal 17. The current generating circuit 21 is connected to the power supply terminal 18 via a wiring resistor R4 having a resistance value larger than that of a wiring connecting the abnormality detecting circuit 20 to the power supply terminal 18.

The non-inverting inputs of the comparators 24 and 26 are connected to the power supply line 13 at the node N1. The inverting input of the comparator 24 is connected to the power supply line 13 at the node N2. The inverting input of the comparator 26 is connected to the power supply line 13 at the node N3. The inverting inputs of the comparators 25 and 27 are connected to the power supply line 14 at a node N4. The non-inverting input of comparator 25 is connected to power supply line 14 at node N5. The non-inverting input of comparator 27 is connected to power supply line 14 at node N6.

The control circuit 28 is a circuit that controls the switches 21b, 22b, 23b of the current generating circuits 21, 22, 23 and the comparators 24 to 27, and determines whether or not an abnormality is detected by comparison results from the comparators 24 to 27. Details will be described later. Although the control circuit 28 is operated with the first and second power supply voltages in FIG. 1, the control circuit 28 may be operated with another power supply voltage. The control circuit 28 may be a dedicated circuit or may be a CPU.

Nodes used in the present embodiment will be described. In the present embodiment, the nodes are used as connecting points with the power supply wiring, but they do not refer to a single point on the power supply wiring. In the power supply wiring, a node name is assigned to a representative point of a portion having substantially the same potential.

For example, in FIG. 1, although the resistor of the current generating circuit 21 is connected to the power supply wiring 13 at the node N0, the potential of the node N0 is substantially the same as the potential of the node N1. Therefore, in the present embodiment, it is expressed that the current generator 21 is connected to the node N1. The same applies to the other nodes.

Figure 2:
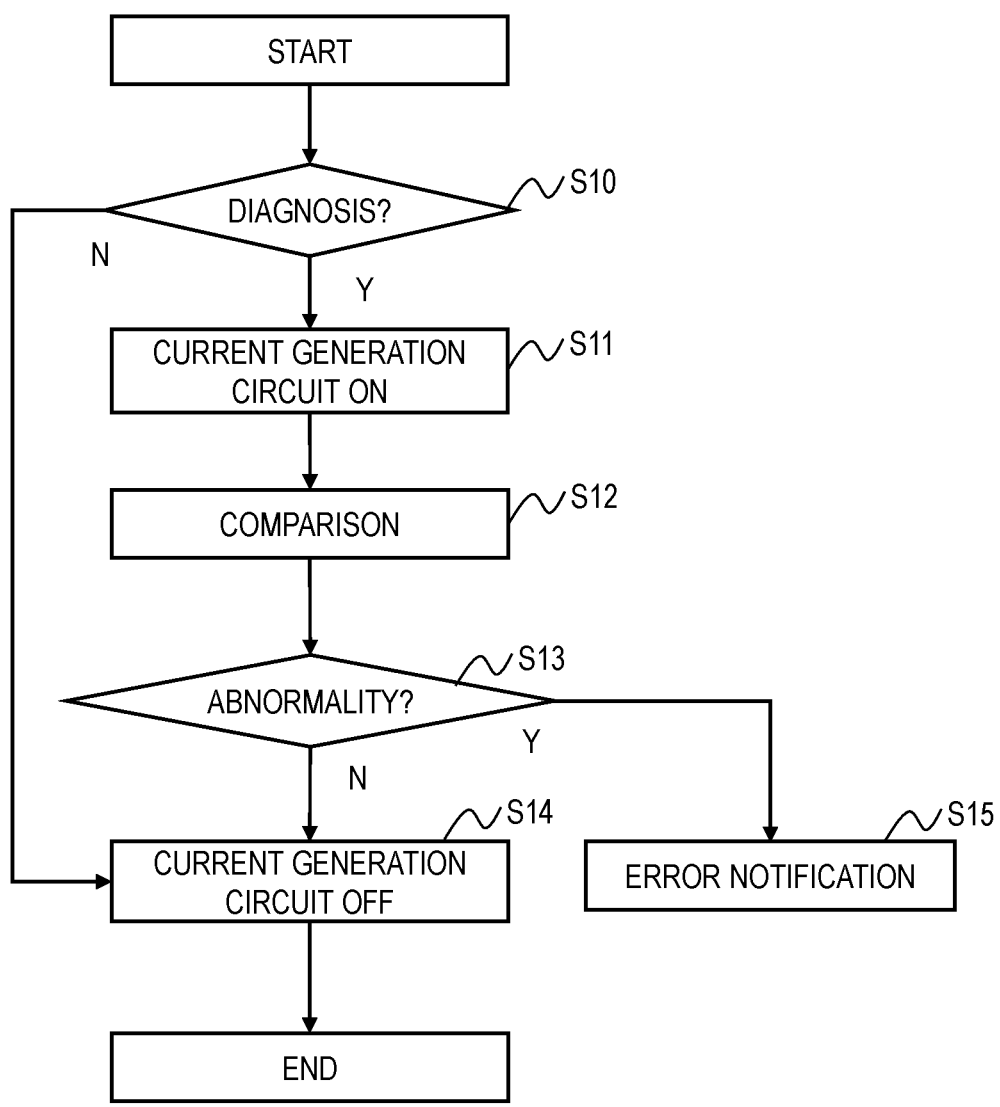
FIG. 2 is a flow chart showing the operation of the semiconductor device according to the first embodiment.

Next, an operation of the semiconductor device 10 will be described. FIG. 2 is a flowchart showing the operation of the control circuit 28. First, in step S10, it is determined whether or not the abnormality detection circuit 19 and 20 performs an abnormality diagnosis. In the first embodiment, it is desirable to diagnose an anomaly prior to normal operation of the semiconductor device 10. For example, it may be performed at the time of turning on the power of the semiconductor device 10 or at the time of returning from a sleep mode to a operation mode.

When the abnormality diagnosis is not performed, the control circuit 28 turns off the switches 21b, 22b, and 23b of the current generation circuits 21, 22, and 23, respectively. In step S14, the control circuit 28 outputs a control signal for invalidating the comparison operation of each of the comparators 24 to 27. In this case, no current flows through each of the current generating circuits 21, 22, and 23, and the comparators 24 to 27 do not output the comparison result (or output a signal for judging that the diagnosis result by the control circuit 28 described later is "normal").

When the abnormality diagnosis is performed, the control circuit 28 turns on the switches 21b, 22b, and 23b of the current generation circuits 21, 22, and 23, respectively. In step S11, the control circuit 28 outputs a control signal for enabling the comparison operation of each of the comparators 24 to 27.

Next, the operation of the current generating circuits 21 to 23 and the operation of the comparators 24 to 27 in the case of performing the abnormality diagnosis will be described in step S12.

First, a case where there is no abnormality such as a disconnection or a soldering failure in the power supply terminals 15 to 18 will be described. When the switches 21b, 22b, and 23b are turned on by the control circuit 28, a current flows from the power supply terminals 15 and 16 to the power supply terminals 17 and 18 via the current generating circuits 21 to 23. More specifically, a current flows from the power supply terminal 15 to the power supply terminal 17 via the node N3, the current generating circuit 22, and the node N6. Current flows from the power supply terminal 16 to the power supply terminal 18 via the node N2, the current generating circuit 23, and the node N5. Current flows from the power supply terminals 15 and 16 to the power supply terminals 17 and 18 via the nodes N2 and N3, the resistors R1 and R2, the node N1, the current generating circuit 21, the node N4, the resistors R3 and R4, and the nodes N5 and N6.

Figure 3:
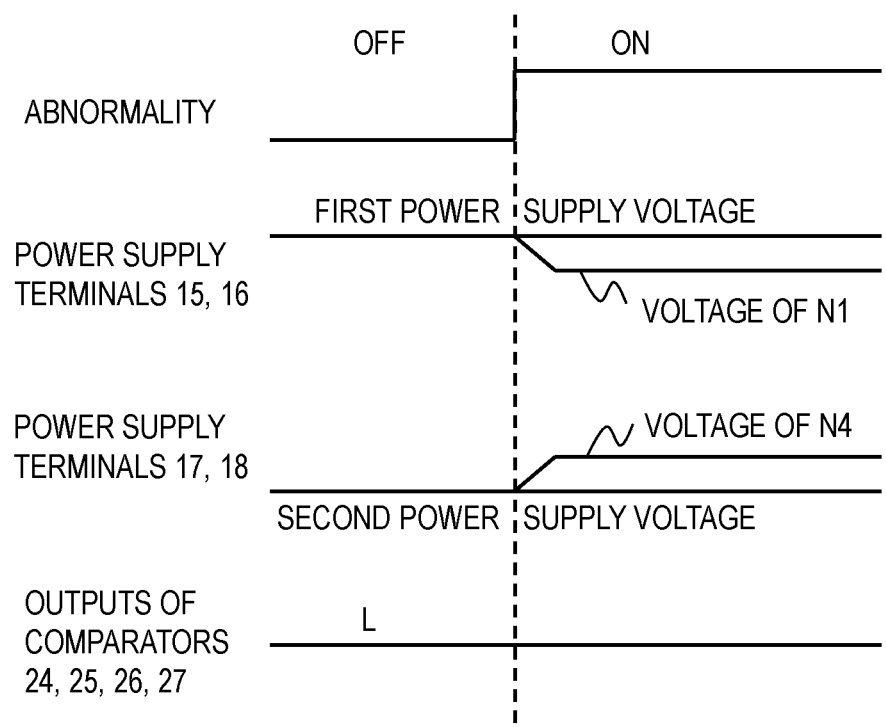
FIG. 3 is a diagram showing voltages of the semiconductor device according to the first embodiment.

FIG. 3 shows voltages of the power supply terminals 15 to 18 and the nodes N1 and N4. When there are no abnormalities in the power supply terminals 15 and 16, the first power supply voltage such as 5 V or 3 V is supplied, and the nodes N2 and N3 also have the same voltage as the first power supply voltage. This is because the nodes N2 and N3 are nodes in the vicinity of the power supply terminals 15 and 16 on the power supply wiring 13. When there is no abnormality in the power supply terminals 17 and 18, the nodes N5 and N6 have the same voltage as the second power supply voltage (ground voltage). This is because the nodes N5 and N6 are nodes in the vicinity of the power supply terminals 17 and 18 on the power supply wiring 14. The voltage of the node N1 is lower than the first power supply voltage. This is because, as described above, since a current flows from the power supply terminals 15 and 16 via the resistors R1 and R2 and the current generating circuit 21, a voltage drop from the voltages of the power supply terminals 15 and 16 is generated. The voltage of the node N4 is higher than the second power supply voltage. This is because the current flowing from the power supply terminals 15 and 16 to the node N4 via the current generating circuit 21 flows to the power supply terminals 17 and 18 via the resistors R3 and R4.

A voltage of the non-inverting input of the comparator 24 is lower than the first power supply voltage because the non-inverting input is connected to the node N1. A voltage of the inverting input of the comparator 24 is the first power supply voltage because the inverting input is connected to the node N2. Therefore, the comparator 24 outputs a low level (L) as a comparison result. Similarly, in the comparator 26, since the non-inverting input is connected to the node N1, the voltage of the non-inverting input is lower than the first power supply voltage, and since the inverting input is connected to the node N3, the voltage of the inverting input is the first power supply voltage. Therefore, the comparator 26 also outputs L as a comparison result.

Since the non-inverting input of the comparator 25 is connected to the node N5, it becomes the second power supply voltage. Since the inverting input of the comparator 25 is connected to the node N4, the voltage is higher than the second power supply voltage. Therefore, the comparator 25 outputs L. Similarly, since the non-inverting input of the comparator 27 is connected to the node N6, the voltage of the non-inverting input of the comparator 27 becomes the second power supply voltage. Since the inverting input of the comparator 27 is connected to the node N4, the voltage of the inverting input is higher than the second power supply voltage. Therefore, the comparator 27 also outputs L.

Since all the comparators 24 to 27 output L, the control circuit 28 determines that no abnormality has occurred in all the power supply terminals 15 to 18, and outputs the determination result in step S13. The determination result may be output from the external terminal to the outside of the semiconductor device 10, or may be output to a CPU (not shown) included in the semiconductor device 10 to instruct the CPU to continue the operation. When it is determined that the abnormality has not occurred, the control circuit 28 turns off the switches 21b, 22b, and 23b of the respective current generating circuits 21 to 23, and ends the abnormality diagnosis in step S14.

Next, a case where any of the power supply terminals 15 to 18 has an abnormality such as a disconnection or a soldering failure will be described. Here, the case where the power supply terminal 15 has an abnormality will be described. When the switches 21b, 22b, and 23b are turned on by the control circuit 28, a current flows from the power supply terminal 16 to the power supply terminal 18 via the node N2, the current generating circuit 23, and the node N5. When the switches 21b, 22b, and 23b are turned on by the control circuit 28, a current flows from the power supply terminal 16 to the power supply terminals 17 and 18 via the node N2, the resistor R2, the node N1, the current generating circuit 21, and the resistors R3 and R4. Although no current flows from the abnormal power supply terminal 15, a current flows from the power supply terminal 16 to the power supply terminal 17 via the node N2, the resistor R2, the node N1, the resistor R1, the current generating circuit 22, and the node N6.

Figure 4:
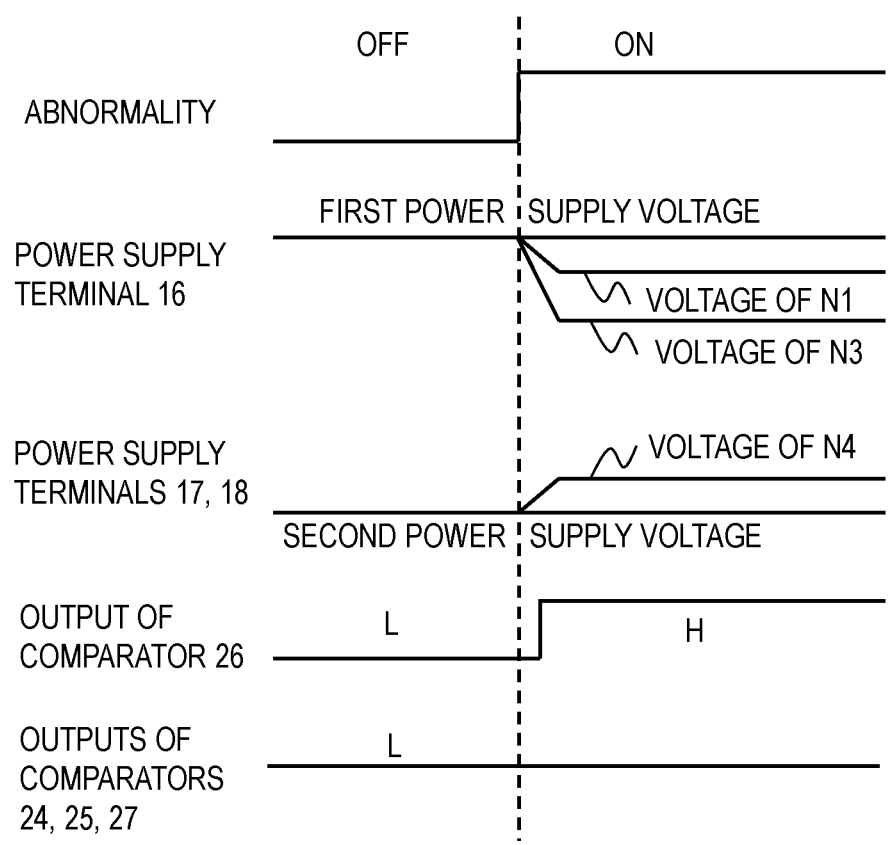
FIG. 4 is a diagram showing voltages of the semiconductor device according to the first embodiment.

FIG. 4 shows voltages of the power supply terminals 16 to 18 and the nodes N1, N3, and N4. The voltage of the node N1 becomes lower than the first power supply voltage due to the voltage drop of the resistor R2. The voltage of the node N3 is lower than the voltage of the node N1. This is because, as described above, a current flows from the power supply terminal 16 to the node N3 via the node N2, the resistor R2, and the resistor R1, so that a voltage drop larger than that of the node N1 is generated.

Since the non-inverting input of the comparator 26 is N1 (a voltage lower than the first power supply voltage) and the inverting input thereof is N3 (a voltage further lower than N1), the comparator 26 outputs a high level (H). Since the non-inverting input of the comparator 24 is N1 and the inverting input is N2, the output of the comparator 24 is L. Since the non-inverting input of the comparator 25 is N5 (the second power supply voltage) and the inverting input thereof is N4 (voltage higher than the second power supply voltage), the output of the comparator 25 is L. Since the non-inverting input of the comparator 27 is N6 (the second power supply voltage) and the inverting input thereof is N4 (voltage higher than the second power supply voltage), the output of the comparator 27 is L.

Although the case of the power supply terminal 15 has been described, when an abnormality occurs in the power supply terminal 16 instead of the power supply terminal 15, the comparator 24 outputs H.

Next, a case where there is an abnormality in the power supply terminal 17 will be described. When the switches 21b, 22b, and 23b are turned on by the control circuit 28, a current flows from the current generating circuit 22 to the power supply terminal 18 via the node N6, the resistor R3, the node N4, the resistor R4, and the node N5. When the switches 21b, 22b, and 23b are turned on by the control circuit 28, a current flows from the current generation circuit 21 via the node N4, the resistor R4, and the node N5, and a current flows from the current generation circuit 23 via the node N5. No current flows through the abnormal power supply terminal 17.

Figure 5:
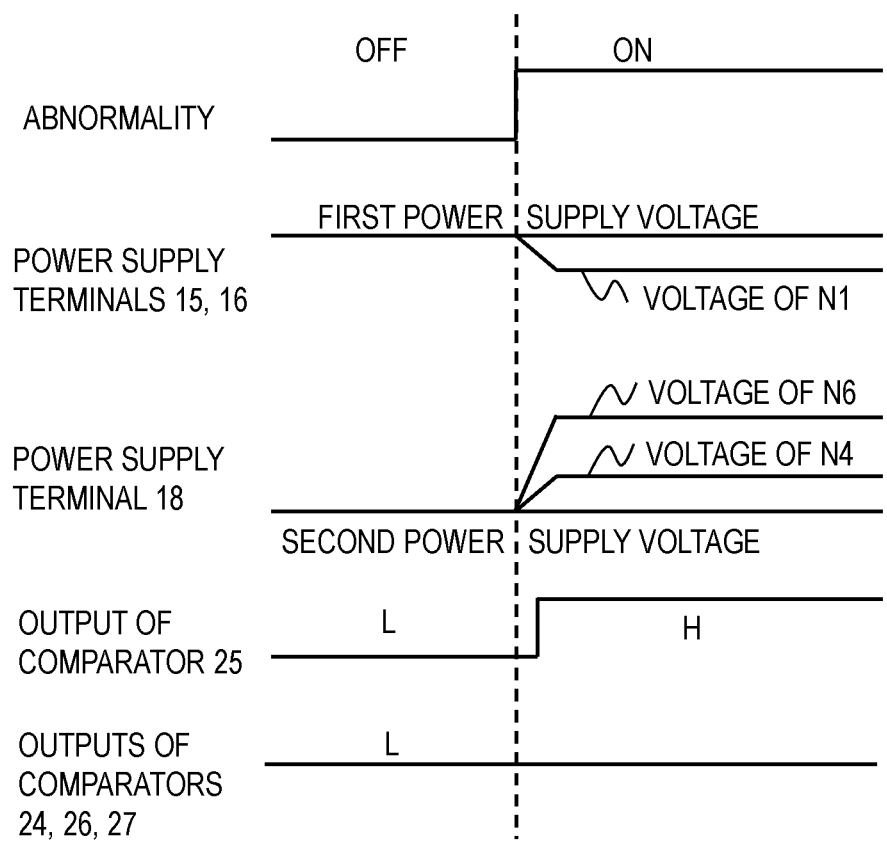
FIG. 5 is a diagram showing voltages of the semiconductor device according to the first embodiment.

FIG. 5 shows voltages of the power supply terminals 15, 16, and 18 and the nodes N1, N4, and N6. As in the case described above, the voltage of the node N1 becomes lower than the first power supply voltage. The voltage at node N4 is higher than the second power supply voltage. The voltage of the node N6 is higher than that of the node N4. This is because a current flows through the current generating circuit 22, the node N6, the resistor R3, the node N4, the resistor R4, and the node N5, so that the voltage of the node N4 is dropped from the node N6 by the resistor R3.

Since the non-inverting input (node N6) of the comparator 27 has a higher voltage than the inverting input (node N4), the comparator 27 outputs H. Since the non-inverting input (node N5) of the comparator 25 has a lower voltage than the inverting input (node N4), the output of the comparator 25 is L. The outputs of the comparators 24 and 26 are also L.

Although the case of the power supply terminal 17 has been described, when an abnormality occurs in the power supply terminal 18 instead of the power supply terminal 17, the comparator 25 outputs H.

When the comparator 26 outputs H, the control circuit 28 can determine that an abnormality has occurred in the power supply terminal 15, and when the comparator 27 outputs H, the control circuit 28 can determine that an abnormality has occurred in the power supply terminal 17. That is, by checking at the output of the comparator corresponding to the power supply terminal, it is possible to determine which power supply terminal has an abnormality. When an abnormality occurs in a part of the power supply terminals, for example, the CPU receiving the determination result outputs a warning of the occurrence of the abnormality, saves the data being processed in the nonvolatile memory, and ends the processing in step S15.

Here, the relationship between the power supply terminals 15 to 18, the abnormality detection circuit 19 (comparators 24 and 25), and the abnormality detection circuit 20 (comparators 26 and 27) will be described. As described above, for example, when an abnormality occurs in the power supply terminal 15, the abnormality detection circuit 20 (comparator 26) detects the abnormality. Here, if the operation power supply voltage (the first power supply voltage) of the abnormality detection circuit 20 is supplied from a node in the vicinity of the power supply terminal 15, the operation of the abnormality detection circuit 20 becomes unstable, and the output result of the abnormality detection circuit 20 is not reliable. Therefore, in the present embodiment, the operating power supply voltage of the anomaly detecting circuit 20 is not supplied from the power supply terminals 15 to be monitored, but from the nodes in the vicinity of the power supply terminals 16. The same applies to the second power supply voltage (ground voltage). The same applies to the abnormality detection circuit 19. As a result, even if the power supply terminal is abnormal, it is possible to suppress the influence on the operation of the abnormality detection circuit.

As described above, in the present embodiment, when an abnormality such as disconnection or soldering failure occurs in any one of the plurality of power supply terminals, it is possible to perform highly accurate abnormality detection while suppressing erroneous detection. In addition, it is possible to detect an abnormality while suppressing the influence of the abnormality that has occurred.

Figure 6:
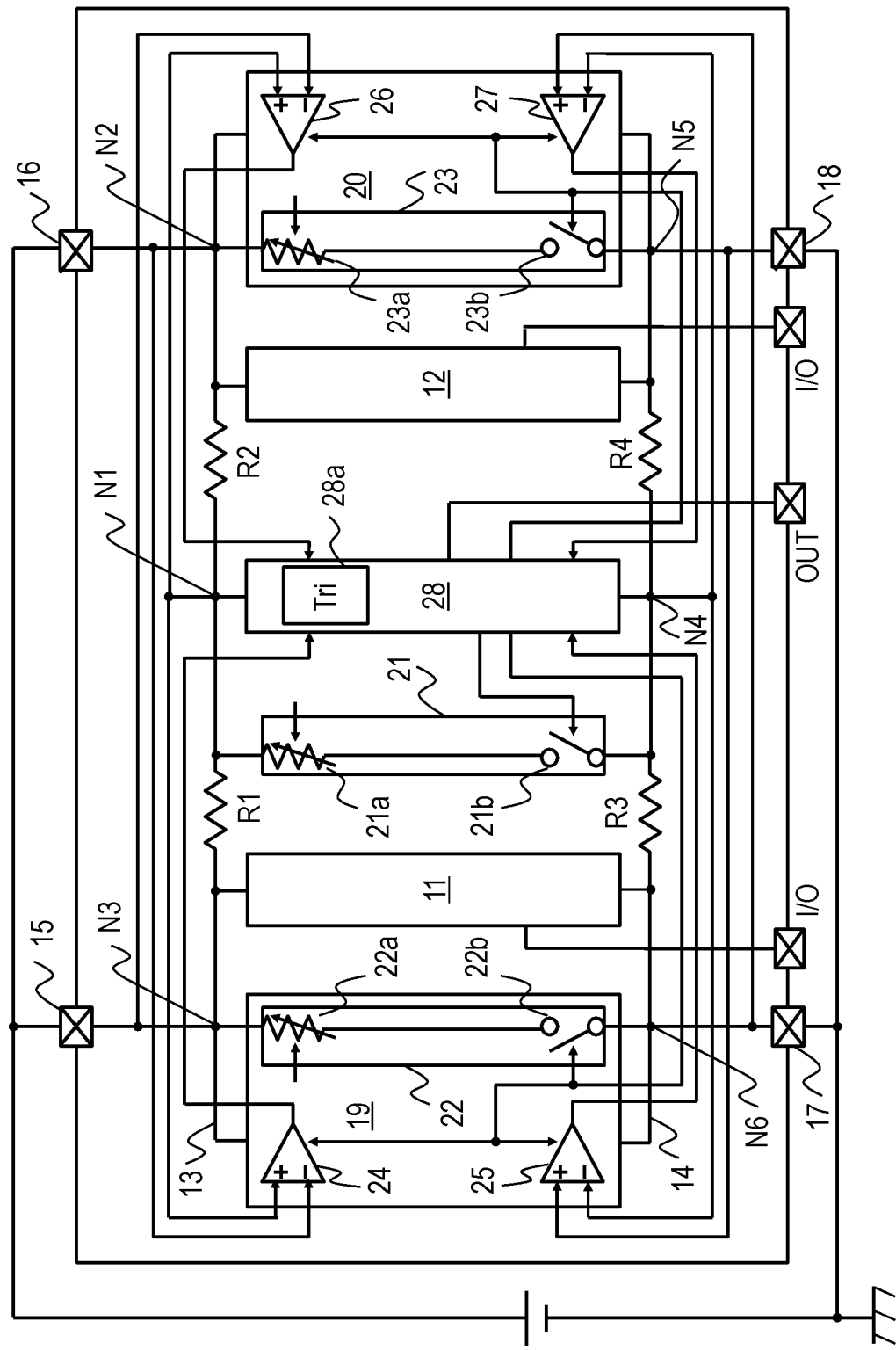
FIG. 6 is a schematic diagram of a modified example of the first embodiment.

FIG. 6 is a modified example. The difference from FIG. 1 is that the resistors of the current generating circuits 21 to 23 are variable resistors. Since the resistors R1, R2, R3, and R4 have manufacturing variations, the first embodiment operation accuracy can be improved by trimming the resistance values of the resistors 21a, 22a, and 23a of the respective current generating circuits 21 to 23. The trimming of the resistance value of each of the resistors 21a, 22a, and 23a is not limited to this, but can be realized by providing the trimming circuit 28a in the control circuit 28.

Second Embodiment

Figure 7:
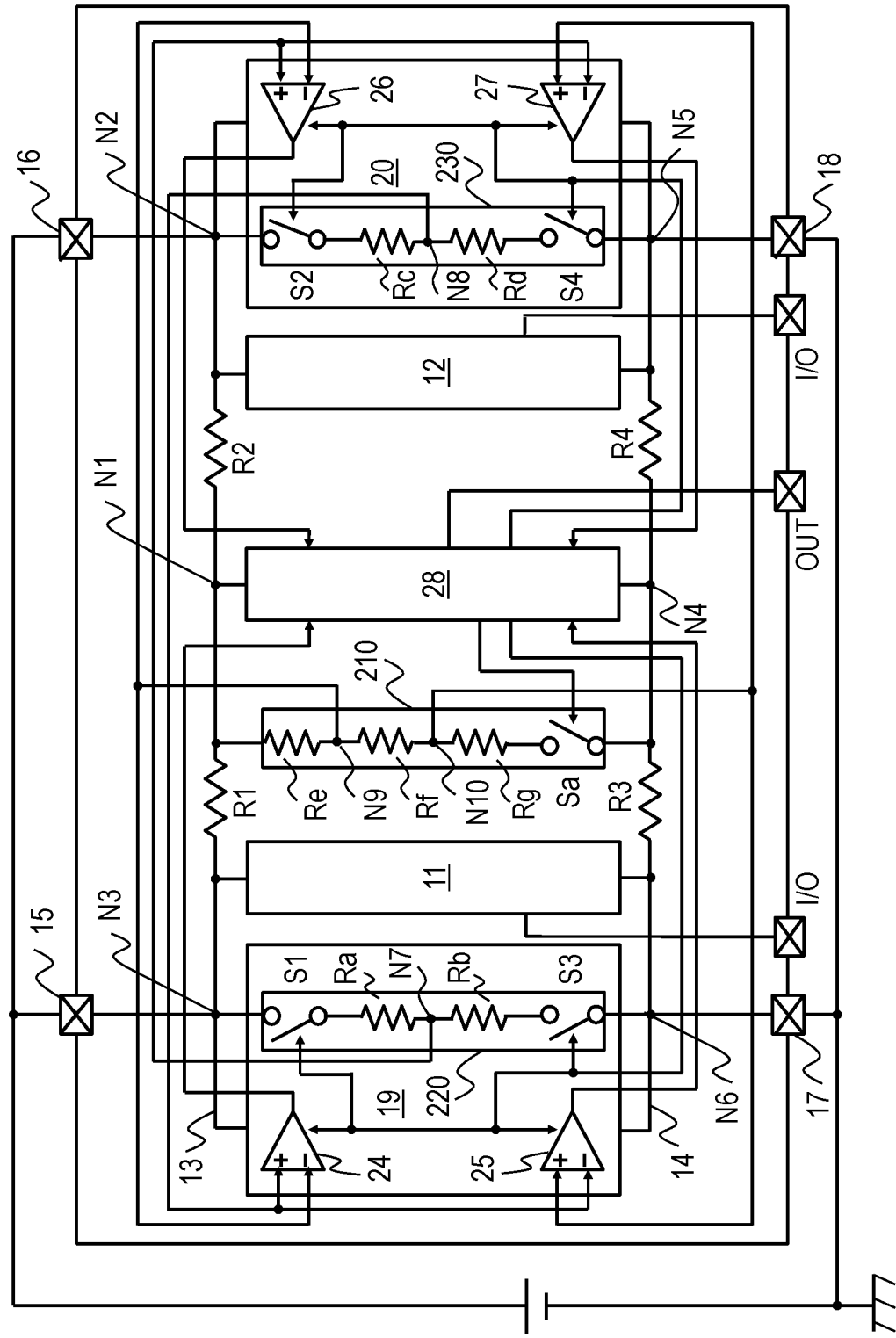
FIG. 7 is a schematic diagram of a semiconductor device according to a second embodiment.

FIG. 7 is a block diagram showing a configuration of a semiconductor device 200 according to the second embodiment.

Differences from the first embodiment are that current generation circuits 210 to 230 are provided instead of the current generation circuits 21 to 23. The current generating circuits 210 to 230 are connected to the power supply wires 13 and 14 in the same manner as the first embodiment.

The current generating circuit 220 includes two resistors Ra and Rb connected in series with two switches S1 and S3. One end of the two series resistors Ra and Rb is connected to the power supply wiring 13 via the switch S1 and the other end is connected to the power supply wiring 14 via the switch S3. Here, it is preferable that the two resistors Ra and Rb have the same resistance value. The current generating circuit 230 similarly includes two resistors Rc and Rd connected in series with two switches S2 and S4. It is desirable that the two resistors Rc and Rd have the same resistance value.

The current generating circuit 210 includes three resistors Re, Rf, and Rg connected in series and a switch Sa. One end of the three series resistors Re, Rf, and Rg is connected to the power supply wiring 13 and the other end is connected to the power supply wiring 14 via the switch Sa. It is preferable that the resistance Re connected to the power supply wiring 13 and the resistance Rg connected to the power supply wiring 14 via the switch Sa have the same resistance value.

The non-inverting input of the comparator 24 is connected to the node N8 between the two resistors Rc and Rd of the current generating circuit 230. The inverting input of the comparator 24 is connected to the other end (node N9) of the resistor Re, one end of which is connected to the power supply wiring 13, in the current generating circuit 210. The non-inverting input of the comparator 25 is connected to the other end (node N10) of the resistor Rg, one end of which is connected to the switch Sa, in the current generating circuit 210. The inverting input of comparator 25 is connected to node N8.

The non-inverting input of the comparator 26 is connected to the node N7 between the two resistors Ra and Rb of the current generating circuit 220. The inverting input of the comparator 26 is connected to the node N9. The non-inverting input of the comparator 27 is connected to the node N10. The inverting input of comparator 27 is connected to node N7.

Figure 8:
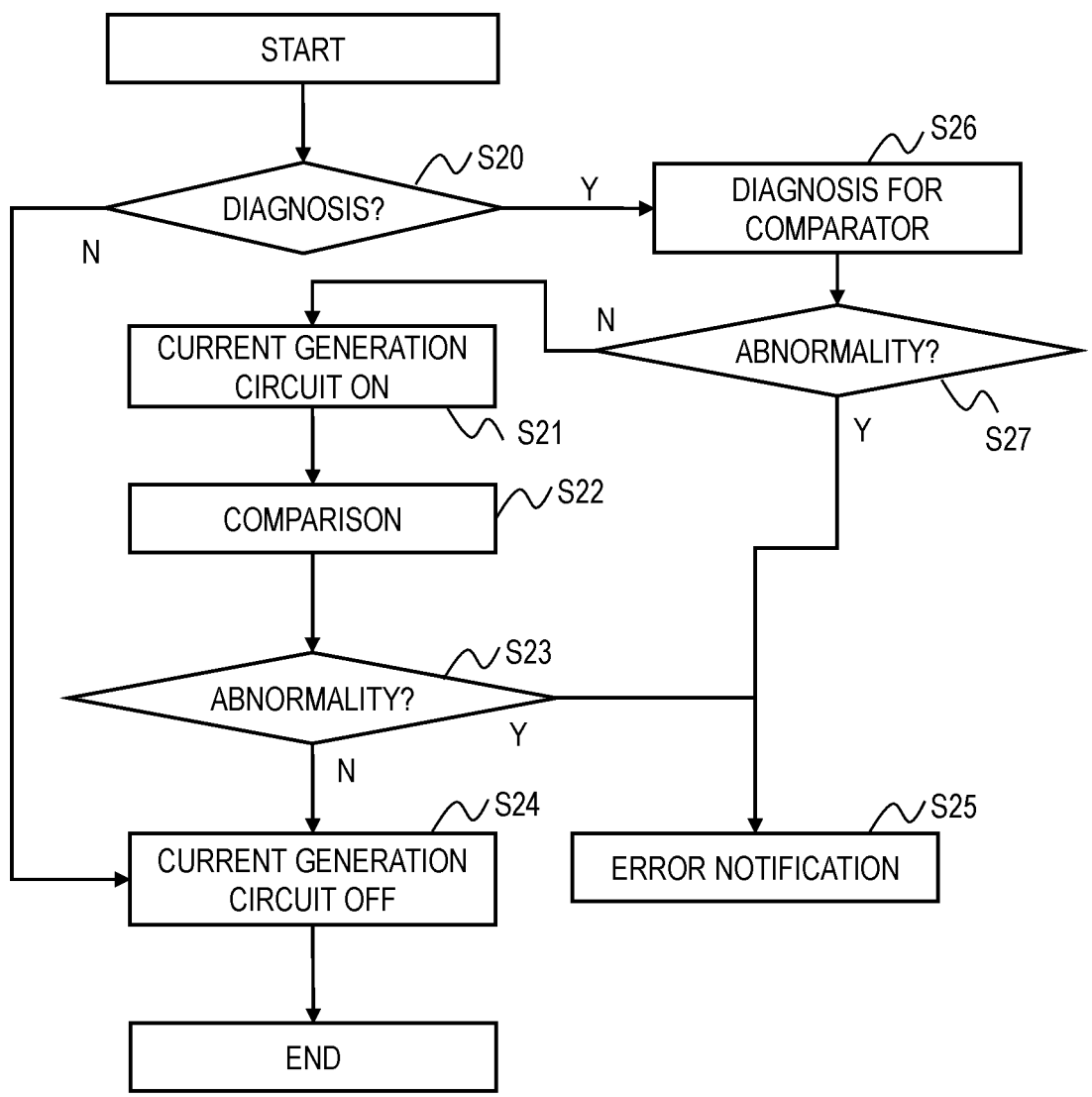
FIG. 8 is a flow chart showing the operation of the semiconductor device according to the second embodiment.

Then, the operation of semiconductor device 200 will be described. FIG. 8 is a flowchart showing the operation of the control circuit 28. Steps S20 to S25 are the same as steps S10 to S15 in FIG. 2. In the second embodiment, steps S26 and S27 are further added.

First, in step S20, the abnormality detection circuits 19 and 20 determine whether to perform abnormality diagnosis. When the abnormality diagnosis is not performed, the control circuit 28 turns off the switches Sa, S1, S3, S2, and S4 of the current generation circuits 210 to 230, respectively. In step S24, the control circuit 28 outputs a control signal for invalidating the comparison operation of each of the comparators 24 to 27.

In the case where the abnormality diagnosis is performed, steps S26 and S27 are performed, but here, the case where the abnormality does not occur in step S27, that is, steps from S21 will be described. Steps S26 and S27 will be described later.

In step S21, the control circuit 28 turns on the switches Sa, S1, S3, S2, and S4 of the current generation circuits 210 to 230, and outputs a control signal for enabling the comparison operation of the comparators 24 to 27.

Next, the operation of the current generating circuits 210 to 230 and the operation of the comparators 24 to 27 in the case of performing the abnormality diagnosis will be described in step S22.

First, a case where there is no abnormality such as a disconnection or a soldering failure in the power supply terminals 15 to 18 will be described. When the switches Sa, S1, S3, S2, and S4 are turned on by the control circuit 28, a current flows from the power supply terminals 15 and 16 to the power supply terminals 17 and 18 via the current generating circuits 210 to 230. More specifically, a current flows from the power supply terminal 15 to the power supply terminal 17 via the node N3, the current generating circuit 220, and the node N6. In addition, a current flows from the power supply terminal 16 to the power supply terminal 18 via the node N2, the current generating circuit 230, and the node N5. Current flows from the power supply terminals 15 and 16 to the power supply terminals 17 and 18 via the nodes N2 and N3, the resistors R1 and R2, the node N1, the current generating circuit 210, the node N4, the resistors R3 and R4, and the nodes N5 and N6.

Figure 9:
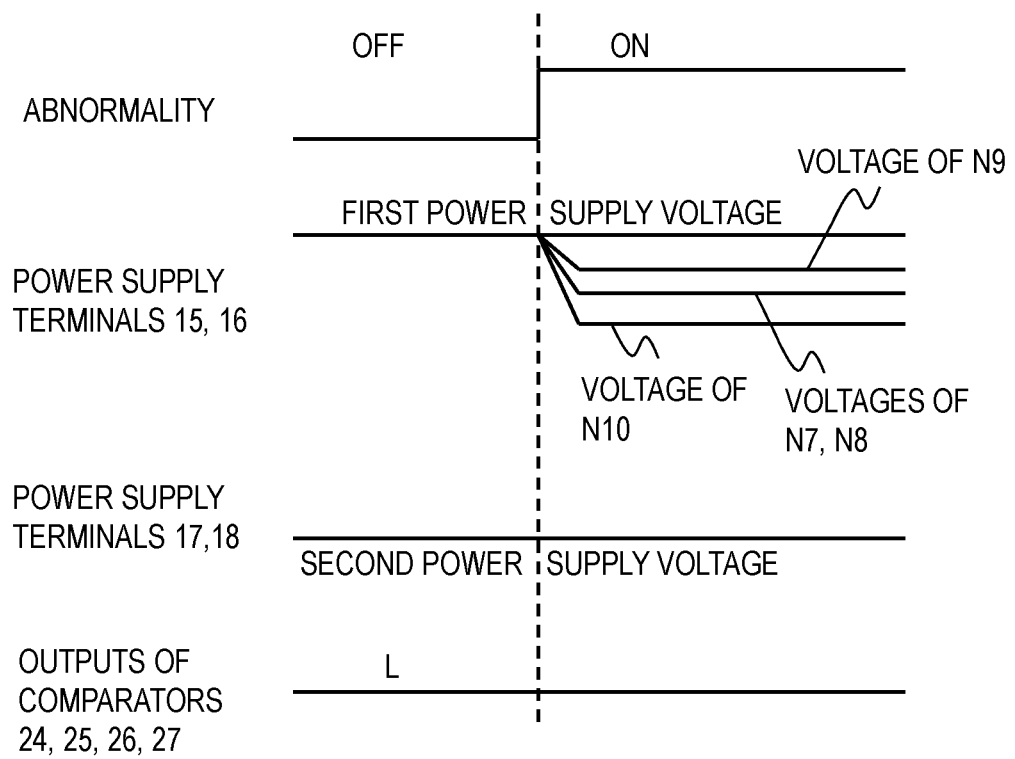
FIG. 9 is a diagram showing voltages of the semiconductor device according to the second embodiment.

FIG. 9 shows voltages of the power supply terminals 15 to 18 and the nodes N7, N8, N9, and N10. If there is no abnormality in the power supply terminals 15 and 16, the first power supply voltage is supplied, and the nodes N2 and N3 also have the same voltage as the first power supply voltage. If there is no abnormality in the power supply terminals 17 and 18, the second power supply voltage (ground voltage) is supplied to the power supply terminals 17 and 18, and the nodes N5 and N6 also have the same voltage as the second power supply voltage. Since the voltage between the power supply terminals 15 and 17 is divided by the two resistors Ra and Rb in the current generating circuit 220, the voltage of the node N7 is ½ of the first power supply voltage. The node N8 is also ½ of the first power supply voltage. The voltages of the nodes N9 and N10 are two voltages obtained by dividing the voltage between the power supply terminals 15 and 16 and the power supply terminals 17 and 18 by the resistors R1 to R4 and the three resistors Re, Rf, and Rg in the current generating circuit 210. Assuming that the resistors R1 to R4 have substantially the same resistance value, the voltage of the node N9 becomes a voltage higher than ½ of the first power supply voltage. The voltage of the node N10 is lower than ½ of the first power supply voltage.

Since the non-inverting input of the comparator 24 is connected to the node N8, it is ½ of the first power supply voltage. Since the inverting input of the comparator 24 is connected to the node N9, it is a voltage higher than ½ of the first power supply voltage. Therefore, the comparator 24 outputs L. Since the non-inverting input of the comparator 25 is connected to the node N10, the voltage is lower than ½ of the first power supply voltage. Since the inverting input of the comparator 25 is connected to the node N8, it is ½ of the first power supply voltage. Therefore, the comparator 25 outputs L. Since the non-inverting input of the comparator 26 is connected to the node N7, it is ½ of the first power supply voltage. Since the inverting input of the comparator 26 is connected to the node N9, it is a voltage higher than ½ of the first power supply voltage. Therefore, the comparator 26 outputs L. Since the non-inverting input of the comparator 27 is connected to the node N10, the voltage is lower than ½ of the first power supply voltage. Since the inverting input of the comparator 27 is connected to the node N7, it is ½ of the first power supply voltage. Therefore, the comparator 27 outputs L.

Since all of the comparators 24 to 27 output L, the control circuit 28 determines that no abnormality has occurred in all of the power supply terminals 15 to 18, and outputs the determination result. When it is determined that the abnormality has not occurred, the control circuit 28 turns off the switches Sa, S1, S3, S2, and S4 of the current generating circuits 210 to 230, and ends the abnormality diagnosis in step S24.

Next, a case where any of the power supply terminals 15 to 18 has an abnormality will be described. Here, the case where the power supply terminal 15 has an abnormality will be described. When the switches Sa, S1, S3, S2, and S4 are turned on by the control circuit 28, a current flows from the power supply terminal 16 to the power supply terminals 17 and 18. Although no current flows from the abnormal power supply terminal 15, a current flows from the power supply terminal 16 to the power supply terminal 17 through the node N2, the resistor R2, the node N1, the resistor R1, the current generating circuit 220, and the node N6.

Figure 10:
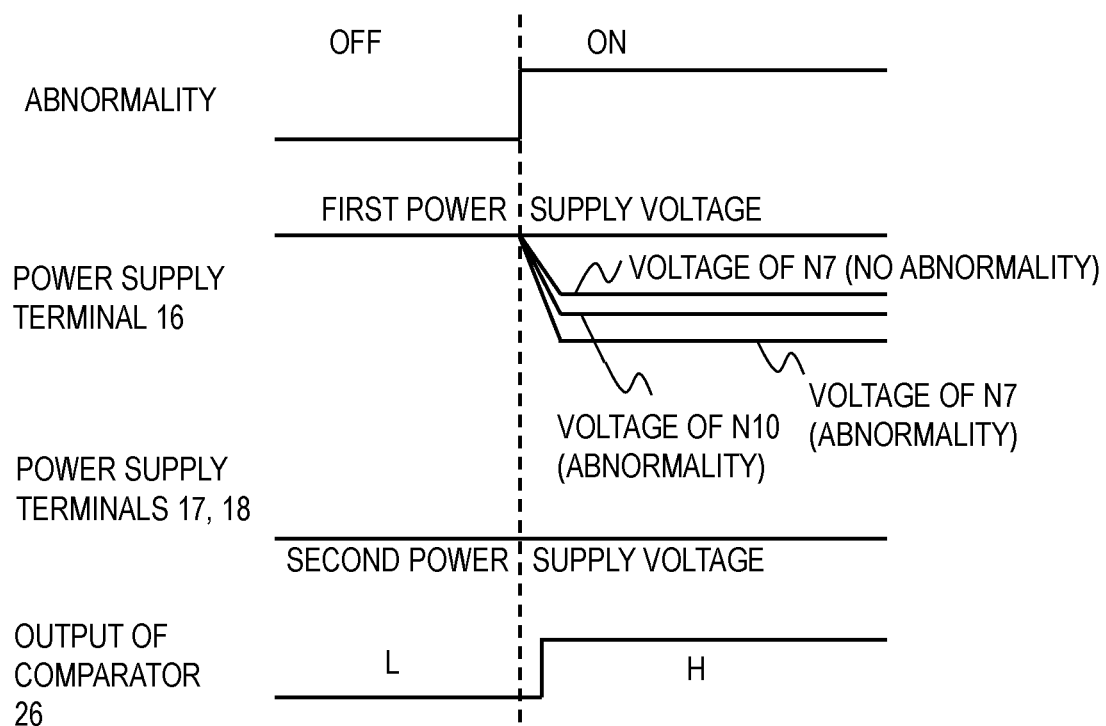
FIG. 10 is a diagram showing voltages of the semiconductor device according to the second embodiment.

FIG. 10 shows voltages of the nodes N7 and N10. When there is an abnormality in the power supply terminal 15, the voltage of the node N7 is lower than the voltage when there is no abnormality in the power supply terminal 15, i.e., ½ of the first power supply voltage. The voltage of the node N10 is lower than the voltage at the time when there is no abnormality in the power supply terminal 15, i.e., a voltage lower than ½ of the first power supply voltage. This is because, as described above, the current from the power supply terminal 15 does not flow, and the current flows from the power supply terminal 16 through the resistor R2, the current generating circuit 210, the resistor R1, and the current generating circuit 220. At this time, the resistance values of the three resistors Re, Rf, and Rg of the current generating circuit 210 are determined in advance so that the voltage of the node N7 becomes lower than the voltage of the node N10. For example, when the resistance value of each of the resistors Ra and Rb in the current generating circuit 220 is higher than that of each of the resistors in the current generating circuit 210, the voltage variation of the node N7 at the time of abnormality becomes small. Therefore, a resistance ratio of Re (Rg) and Rf should be large. When the resistance values of the resistors Ra and Rb in the current generating circuit 220 are lower than the resistance values of the resistors Re, Rf and Rg in the current generating circuit 210, the voltage variation of the node N7 at the time of abnormality becomes large. Therefore, a resistance ratio of Re (Rg) and Rf should be small.

Since the non-inverting input of the comparator 27 is connected to the node N10 and the inverting input thereof is connected to the node N7, the comparator 27 outputs H.

Next, a description will be given of a case where there is an abnormality in the power supply terminal 17. When the switches Sa, S1, S3, S2, and S4 are turned on by the control circuit 28, a current flows from the power supply terminals 15 and 16 to the power supply terminal 18. Since no current flows to the abnormal power supply terminal 17, the current from the current generating circuit 220 flows to the power supply terminal 18 through the node N6, the resistor R3, the node N4, the resistor R4, and the node N5.

Figure 11:
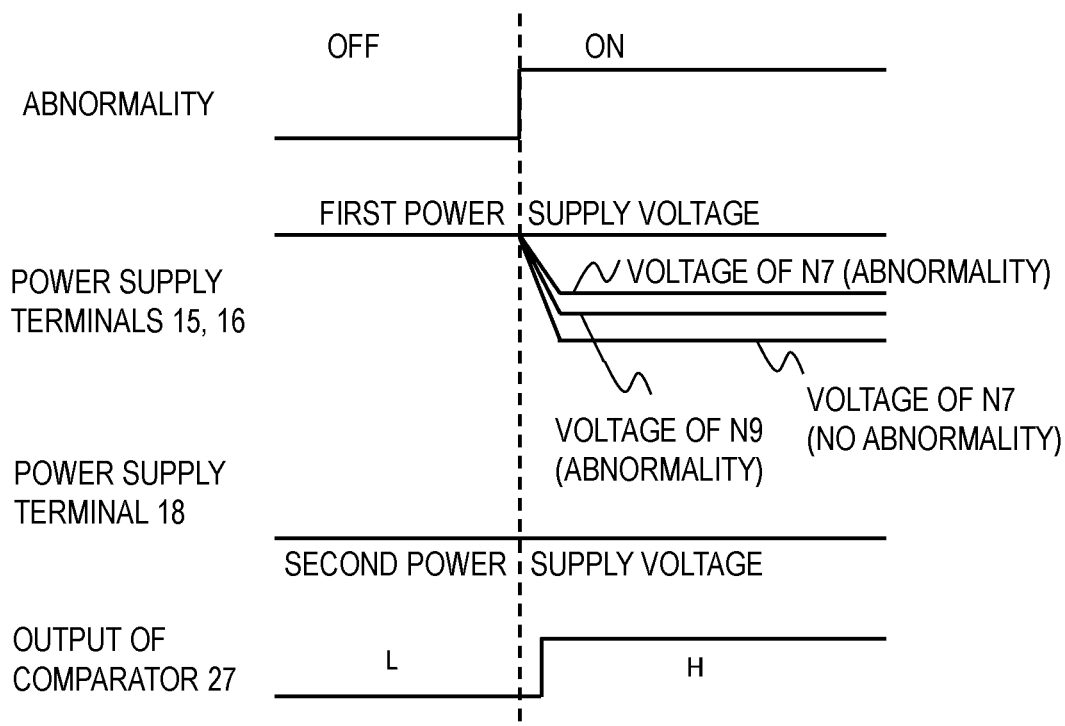
FIG. 11 is a diagram showing voltages of the semiconductor device according to the second embodiment.

FIG. 11 shows voltages of the nodes N7 and N9. When there is an abnormality in the power supply terminal 17, the voltage of the node N7 is higher than the voltage at the time when there is no abnormality in the power supply terminal 17, i.e., ½ of the first power supply voltage. The voltage of the node N9 is higher than the voltage at the time when there is no abnormality in the power supply terminal 17, i.e., a voltage higher than ½ of the first power supply voltage. This is because, as described above, the current from the current generating circuits 210 and 220 does not flow to the power supply terminal 17, but flows to the power supply terminal 18 via the resistors R3 and R4. At this time, the resistance values of the three resistors Re, Rf, and Rg of the current generating circuit 210 are determined so that the voltage of the node N7 becomes higher than the voltage of the node N9. For example, when the resistance values of the resistors Ra and Rb in the current generating circuit 220 are higher than the resistance values of the resistors Re, Rf, and Rg in the current generating circuit 210, the voltage fluctuation of the node N7 at the time of abnormality becomes small. Therefore, a resistance ratio of Re (Rg) and Rf should be large. When the resistance values of the resistors Ra and Rb in the current generating circuit 220 are lower than the resistance values of the resistors Re, Rf and Rg in the current generating circuit 210, the voltage variation of the node N7 at the time of abnormality becomes large. Therefore, a resistance ratio of Re (Rg) and Rf should be small.

Since the non-inverting input of the comparator 26 is connected to the node N7 and the inverting input thereof is connected to the node N9, the comparator 26 outputs H.

Although the case where the power supply terminal 15 or 17 has an abnormality has been described, the comparators 25 and 24 similarly output H when the power supply terminal 16 or 18 has an abnormality.

When the comparator 27 outputs H, the control circuit 28 can determine that an abnormality has occurred in the power supply terminal 15, and when the comparator 26 outputs H, the control circuit 28 can determine that an abnormality has occurred in the power supply terminal 17. The same applies to the comparators 24 and 25. When it is determined that an abnormality has occurred, the control circuit 28 can output a warning of the occurrence of the abnormality and cause the CPU (not shown) to take measures such as saving data being processed (step S25).

The connection relationship between the power supply terminals 15 to 18 and the abnormality detection circuits 19 and 20 is the same as that in the first embodiment. This makes it possible to suppress the influence on the operation of the abnormality detection circuit even when there is an abnormality in the power supply terminal. In addition, erroneous detection of an abnormal state can be suppressed.

Returning to FIG. 8, steps S26 and S27 will be described. In the second embodiment, in order to increase the reliability of the diagnosis result, the abnormality diagnosis of the comparators 24 to 27 is performed in steps S26 and S27.

When it is selected to perform the abnormality diagnosis in step S20, the control circuit 28 outputs a control signal for enabling the switch Sa of the current generation circuit 210 and the comparison operation of each of the comparators 24 to 27. Next, the control circuit 28 turns off the switch S1 and turns on the switch S3 of the current generating circuit 220. At this time, the inverting input of the comparator 27 becomes the second power supply voltage, i.e., the ground voltage. Therefore, the comparator 27 outputs H when there is no abnormality. When the switch S1 is turned on and the switch S3 is turned off, the non-inverting input of the comparator 26 becomes the first power supply voltage. Therefore, the comparator 26 outputs H when there is no abnormality. By similarly operating the switches S2 and S4 of the current generating circuit 230, it is possible to diagnose the comparators 24 and 25.

In step S27, the control circuit 28 diagnoses the comparators 24 to 27 with the output values of the comparators 24 to 27. When each of the comparators 24 to 27 outputs H, it is determined that there is no abnormality in each of the comparators 24 to 27, and the abnormality diagnosis from the above-described step S21 is performed. When any of the comparators 24 to 27 outputs L, the control circuit 28 outputs an error in step S25.

In FIG. 8, the diagnosis of the comparator is performed before the abnormality diagnosis of the power supply terminal is performed, but the diagnosis of the comparator may be performed after the abnormality diagnosis of the power supply terminal is performed.

According to the present embodiment, in addition to the effects of the first embodiment, it is possible to further improve the reliability of abnormality diagnoses and suppress erroneous detection of an abnormal condition.

Third Embodiment

Figure 12:
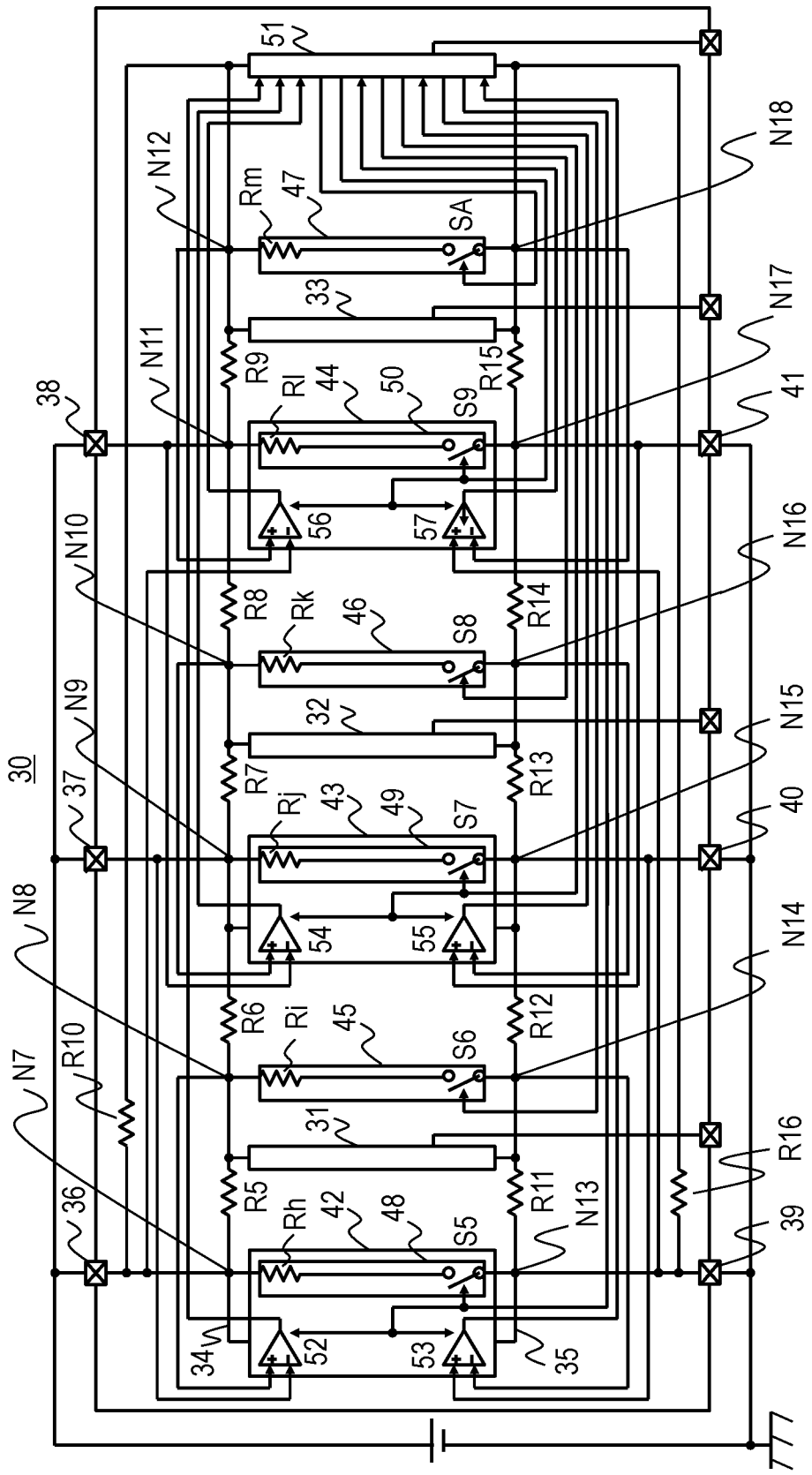
FIG. 12 is a schematic diagram of a semiconductor device according to a third embodiment.

FIG. 12 is a block diagram showing a configuration of a semiconductor device 30 according to a third embodiment.

Differences from FIG. 1 are as follows. First, the number of power supply terminals to which the first power supply voltage is supplied and the number of power supply terminals to which the second power supply voltage is supplied increase from two to three, respectively, i.e., the power supply terminals 36 to 41. The power supply wires 34 and 35 are annularly formed. The number of the current generation circuits 45 to 47, the abnormality detection circuits 42 to 44, and the number of the internal circuits 31 to 33 is increased to three.

The internal configurations of the current generation circuits 45 to 47 and the abnormality detection circuits 42 to 44 are the same as those of FIG. 1. Each of the abnormality detection circuits 42 to 44 is disposed in the vicinity of the power supply terminal as in FIG. 1. That is, the abnormality detection circuit 42 is connected to the power supply wiring 34 in the vicinity of the power supply terminal 36 (node N7), and is connected to the power supply wiring 35 in the vicinity of the power supply terminal 39 (node N13). The abnormality detection circuit 43 is connected to the power supply wiring 34 in the vicinity of the power supply terminal 37 (node N9), and is connected to the power supply wiring 35 in the vicinity of the power supply terminal 40 (node N15). The abnormality detection circuit 44 is connected to the power supply wiring 34 in the vicinity of the power supply terminal 38 (node N11), and is connected to the power supply wiring 35 in the vicinity of the power supply terminal 41 (node N17). Each of the current generating circuits 45 to 47 is disposed at an intermediate point when viewed from the two power supply terminals, similarly to FIG. 1. That is, the current generating circuit 45 is connected to the power supply wiring 34 at a node N8 which is an intermediate point between the power supply terminal 36 and the power supply terminal 37. The current generating circuit 45 is connected to the power supply wiring 35 at a node N14 which is an intermediate point between the power supply terminal 39 and the power supply terminal 40. The current generating circuit 46 is connected to the power supply wiring 34 at a node N10 which is an intermediate point between the power supply terminal 37 and the power supply terminal 38. The current generating circuit 46 is connected to the power supply wiring 35 at a node N16 which is an intermediate point between the power supply terminal 40 and the power supply terminal 41. The current generating circuit 47 is connected to the power supply wiring 34 at a node N12 which is an intermediate point between the power supply terminal 38 and the power supply terminal 36. The current generating circuit 47 is connected to the power supply wiring 35 at a node N18 which is an intermediate point between the power supply terminal 41 and the power supply terminal 39.

The arrangement of the abnormality detection circuits 42 to 44 will be described in more detail. The non-inverting input of the comparator 52 in the abnormality detection circuit 42 is connected to the node N8, and the inverting input thereof is connected to the node N9. A non-inverting input of the comparator 53 is connected to the node N15, and an inverting input thereof is connected to the node N14. The non-inverting input of the comparator 54 in the abnormality detection circuit 43 is connected to the node N10, and the inverting input thereof is connected to the node N11. The non-inverting input of the comparator 55 is connected to the node N17, and the inverting input is connected to the node N16. The non-inverting input of the comparator 56 in the abnormality detection circuit 44 is connected to the node N12, and the inverting input thereof is connected to the node N7. A non-inverting input of the comparator 57 is connected to the node N13, and an inverting input thereof is connected to the node N18.

Figure 13:
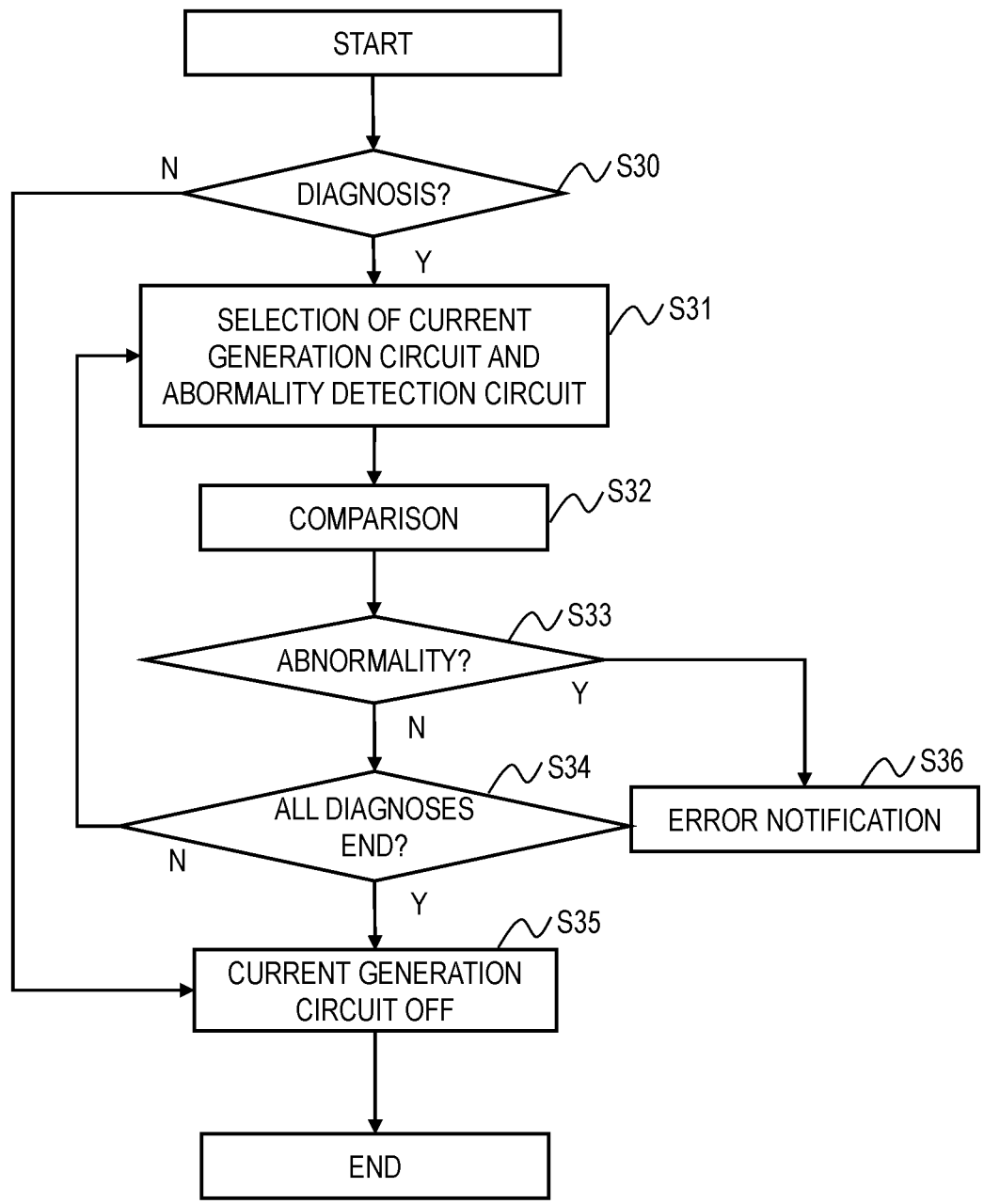
FIG. 13 is a flow chart showing the operation of the semiconductor device according to the third embodiment.

Next, an operation of the semiconductor device 30 will be described. FIG. 13 is a flowchart of the control circuit 51. First, it is determined whether or not an abnormality diagnosis is performed by the abnormality detection circuit in step S30.

When performing the abnormality diagnosis, the control circuit 51 selects two of the current generation circuits 45 to 50 and one of the abnormality detection circuits 42 to 44. In step S31, the current generation circuits 47 and 48 and the abnormality detection circuit 44 are selected. In step S32, a control signal for enabling the comparison operation of the comparators 56 and 57 is output.

First, a case where there is no abnormality such as a disconnection or a soldering failure in the power supply terminals 36 to 41 will be described. When the switches S5, S9, and SA are turned on by the control circuit 51, a current flows from the power supply terminals 36 to 38 to the power supply terminals 39 to 41 via the resistors R5 to R10, which are wiring resistors, and the current generating circuits 47, 48, and 50. At this time, as described in the first embodiment, the nodes N7 and N11 have the same voltage as the first power supply voltage. The node N12 has a voltage lower than the first power supply voltage. Therefore, since the non-inverting input of the comparator 56 has a voltage lower than the first power supply voltage and the inverting input thereof has the same voltage as the first power supply voltage, the comparator 56 outputs L.

When the switches S5, S9, and SA are turned on by the control circuit 51, the current flowing through the current generating circuits 47, 48, and 50 flows to the power supply terminals 39 to 41 through the resistors R11 to R16 which are wiring resistors. At this time, as described in the first embodiment, the nodes N13 and N17 have the same voltage as the second power supply voltage. The node N18 has a voltage higher than the second power supply voltage. Therefore, the non-inverting input of the comparator 57 becomes the second power supply voltage, and the inverting input becomes a voltage higher than the second power supply voltage. Therefore, the comparator 57 outputs L.

Since the comparators 56 and 57 output L, the control circuit 51 determines in step S33 that no abnormality has occurred in the power supply terminals 36 and 39.

Next, a case where any of the power supply terminals 36 to 41 has an abnormality will be described. Here, a case where the power supply terminal 36 is disconnected will be described. When the switches S5, S9, and SA are turned on by the control circuit 51, no current flows from the power supply terminal 36, but a current flows from the power supply terminals 37 and 38 via the resistors R5 to R10 and the current generating circuits 47, 48, and 50. At this time, as described in the first embodiment, the voltage of the node N7 is lower than the voltage of the node N12, which is lower than the first power supply voltage. Therefore, since the inverting input of the comparator 56 is lower than the non-inverting input, the comparator 56 outputs H.

Next, a case where the power supply terminal 39 is disconnected will be described. When the switches S5, S9, and SA are turned on by the control circuit 51, a current flows to the power supply terminals 40 and 41 via the current generating circuits 47, 48, and 50 and the resistors R11 to R16. No current flows through the power supply terminal 39. At this time, as described in the first embodiment, the voltage of the node N13 is higher than that of the node N18.

Therefore, since the non-inverting input of the comparator 57 has a higher voltage than the inverting input, the comparator 57 outputs H.

The control circuit 51 detects that the power supply terminal 36 is abnormal when the switches SA of the abnormality detection circuits 42 and 44 and the current generation circuit 47 are turned on and when the comparator 56 outputs H. In step S33, when the comparator 57 outputs H, it detects that the power supply terminal 39 is abnormal. When an abnormality is detected, the abnormality is notified to the outside of the semiconductor device 30 or to the built-in CPUs (S36).

If no abnormality is detected in step S33, the control circuit 51 next selects the current generation circuits 45 and 49 and the abnormality detection circuit 42 in step S31. In addition, a control signal for enabling the comparison operation of the comparators 52 and 53 is output. In this case, the same operation as described above is performed. If there is an abnormality in the power supply terminal 37, the comparator 52 outputs H. If there is an abnormality in the power supply terminal 40, the comparator 53 outputs H.

If no abnormality is detected again in step S33, the control circuit 51 next selects the current generation circuits 46 and 50 and the abnormality detection circuit 43. Also in this case, if there is an abnormality in the power supply terminal 38, the comparator 54 outputs H. If there is an abnormality in the power supply terminal 41, the comparator 55 outputs H.

If the abnormality is not detected in all the tests (step S34), the control circuit 51 determines that there is no abnormality in all the power supply terminals 36 to 41 (step S34). In step S35, the switches S6, S8, SA, S5, S7, and S9 of all the current generating circuits 45 to 50 are turned off, and the test is finished.

In the third embodiment, the switches S6, S8, SA, S5, S7, and S9 of all the current generating circuits 45 to 50 are not turned on at the same time, and some of the current generating circuits and the anomaly detecting circuits are used for testing. Since the influence of the operation of the abnormality generation circuit can be minimized, the internal circuit can be operated in parallel with the inspection of the power supply terminal. For example, it is assumed that no abnormality is detected in the power supply terminals 36, 37, 39, and 40 and the power supply terminals 38 and 41 are inspected. In this case, it can be said that the operation of the current generating circuits 46, 49, and 50 has very little influence on the internal circuit 31. Therefore, it is possible to normally operate the internal circuit 31 while checking the power supply terminals 38 and 41. By applying this, even during the operation of the semiconductor device 30, the power supply terminal in the vicinity of a block which does not need to be operated, for example, a communication block which does not communicate, can be inspected.

It should be noted that the present invention is not limited to the above-mentioned embodiments, and various modifications can be made without departing from the gist thereof.

What is claimed is:

1. A semiconductor device comprising:
    first and second power supply terminals to which a first power supply voltage is supplied;
    a third power supply terminal to which a second power supply voltage is supplied;
    a power supply wiring coupled to the first and second power supply terminals;
    an abnormality detection circuit which diagnoses the first power supply terminal;
    a first current generation circuit which flows a current from the power supply wiring to the third power supply terminal in a diagnosis; and
    a second current generation circuit which couples to the power supply wiring at a vicinity of the first power supply terminal and flows a current from the power supply wiring to the third power supply terminal in the diagnosis,
    wherein the abnormality detection circuit compares a voltage of the first current generation circuit with a voltage of the second current generation circuit in the diagnosis,
    wherein each of the first and second current generation circuits comprises a resistor and a switch, respectively, and
    wherein the abnormality detection circuit comprises a comparator to which an operating voltage from a vicinity of the second power supply terminal is supplied.

2. The semiconductor device according to claim 1, wherein the resistor is a variable resistor.

3. The semiconductor device according to claim 1, wherein the first current generation circuit is disposed between the first and second power supply terminals.

4. The semiconductor device according to claim 3, further comprising: a third current generation circuit which couples to the power supply wiring at the vicinity of the second power supply terminal and flows a current from the power supply wiring to the third power supply terminal in the diagnosis,
    wherein the abnormality detection circuit further compares the voltage of the first current generation circuit with a voltage of the third current generation circuit to diagnose the second power supply terminal.

5. The semiconductor device according to claim 1, wherein the resistor comprises a plurality of resistors connected in series, and the comparator performs the comparing using a voltage divided by the plurality of resistors.

* * * * *